United States Patent
Kodama et al.

(10) Patent No.: US 6,686,658 B2
(45) Date of Patent: Feb. 3, 2004

(54) SEMICONDUCTOR DEVICE, INCLUDING AN ARRANGEMENT TO PROVIDE A UNIFORM PRESS CONTACT AND CONVERTER USING SAME

(75) Inventors: Hironori Kodama, Hitachi (JP); Mitsuo Katou, Hitachioota (JP); Mamoru Sawahata, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 67 days.

(21) Appl. No.: 10/231,271

(22) Filed: Aug. 30, 2002

(65) Prior Publication Data

US 2003/0001258 A1 Jan. 2, 2003

Related U.S. Application Data

(62) Division of application No. 09/235,384, filed on Jan. 22, 1999.

(30) Foreign Application Priority Data

Jan. 15, 1998 (JP) ............................... 10-104344
Jan. 22, 1998 (JP) ............................... 10-10118
Aug. 12, 1998 (JP) ............................... 10-227847

(51) Int. Cl.$^7$ ............... H01L 29/74; H01L 23/06; H01L 23/16; H01L 23/42; H01L 29/78
(52) U.S. Cl. ............... 257/727; 257/785; 257/182; 257/118; 257/181; 257/688; 257/719; 257/723; 257/730; 257/669; 257/674; 257/718; 363/147
(58) Field of Search .................. 257/785, 182, 257/161, 177, 178, 179, 181, 688, 719, 723, 629, 736, 665, 674, 718, 727, 788; 363/10, 77, 123, 147; 307/151

(56) References Cited

U.S. PATENT DOCUMENTS

| | | | |
|---|---|---|---|
| 4,587,550 A | 5/1986 | Matsuda | 257/181 |
| 4,918,514 A | 4/1990 | Matsuda et al. | 257/719 |
| 5,089,439 A | 2/1992 | Lippey | 428/620 |
| 5,360,985 A | 11/1994 | Hiyoshi et al. | 257/181 |
| 5,866,944 A | 2/1999 | Hiyoshi et al. | 257/719 |
| 6,166,402 A | 12/2000 | Kodani et al. | 257/182 |
| 6,281,569 B1 | 8/2001 | Sugiyama | 257/688 |

FOREIGN PATENT DOCUMENTS

| | | |
|---|---|---|
| DE | 4418679 A | 11/1995 |
| EP | 0285074 A | 10/1988 |
| EP | 0512742 A | 11/1992 |
| EP | 0702406 A2 | 3/1996 |
| FR | 2601477 | 1/1988 |
| GB | 2-074373 A | 10/1981 |
| JP | 8-88240 | 4/1996 |
| JP | 11-87713 | 3/1999 |

Primary Examiner—Alexander O. Williams
(74) Attorney, Agent, or Firm—Antonelli, Terry, Stout & Kraus, LLP

(57) ABSTRACT

In accordance with a press contact type semiconductor device, a metallic body having macroscopic vacancies inside is arranged between a main electrode of the semiconductor device and a main electrode plate, or between an intermediate electrode plate arranged on a respective main plane of the semiconductor element and a main electrode plate.

5 Claims, 14 Drawing Sheets

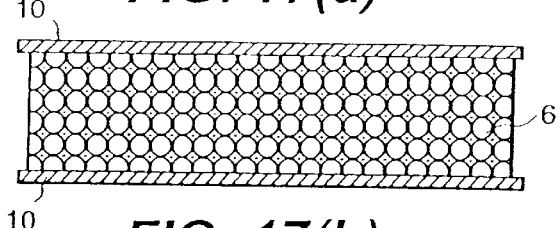
FIG. 17(a)
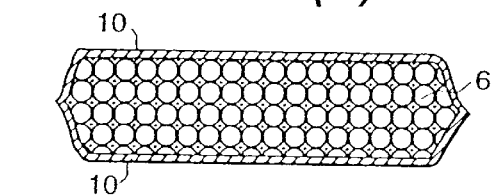
FIG. 17(b)
FIG. 18
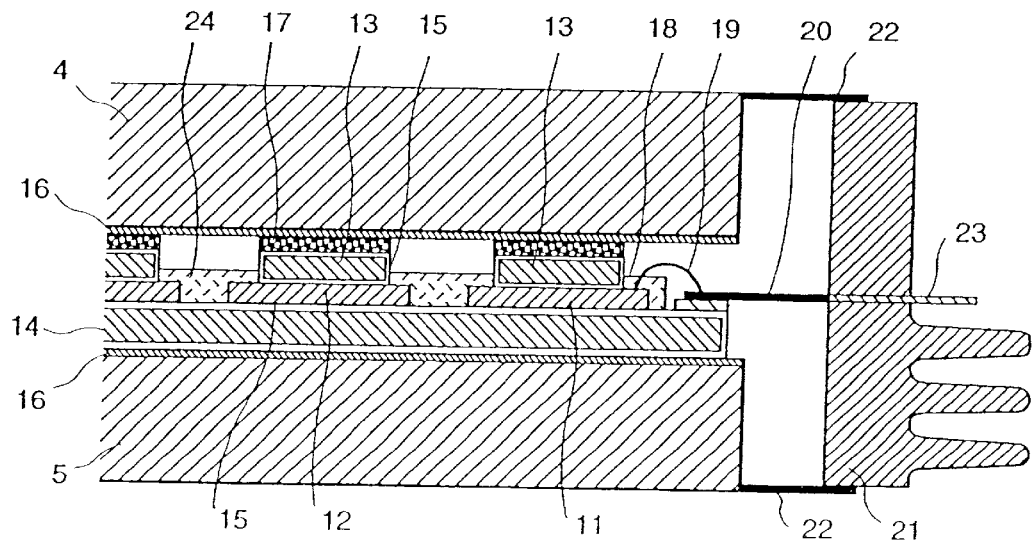

SEMICONDUCTOR DEVICE, INCLUDING AN ARRANGEMENT TO PROVIDE A UNIFORM PRESS CONTACT AND CONVERTER USING SAME

CROSS-REFERENCE TO RELATED APPLICATIONS

This application is a Divisional application of application Ser. No. 09/235,384, filed Jan. 22, 1999.

BACKGROUND OF THE INVENTION

FIELD OF THE INVENTION

The present invention relates to a press contact type semiconductor device, particularly, to a press contact type semiconductor device capable of ensuring a uniform contact condition between semiconductor elements and package electrodes, and of decreasing thermal resistance and electrical resistance, and a converter using the same.

Technology of power electronics, wherein a main circuit current is controlled by using technology of semiconductor electronics, has been applied widely to various fields, and, furthermore, the applied fields are still expanding. Examples of semiconductor elements for power electronics are as follows:

thyristor, light-triggered thyristor, gate-turn-off thyristor (GTO), insulated gate bipolar transistor (hereinafter, called IGBT) which is a MOS controlled device, metal oxide semiconductor field effect transistor (hereinafter, called MOSFET), and others. In these devices, main electrodes (cathode, emitter electrode) are formed on a first main plane of a semiconductor chip, and other main electrodes (anode, collector electrode) are formed on a second main plane of the semiconductor chip.

In the semiconductor devices for large power, such a GTO, light-triggered thyristor, and the like, the semiconductor element is packaged per every wafer. Both main electrodes of the above element have a structure wherein the main electrodes are contacted by pressing with a pair of external main electrode plates in the package via an intermediate electrode plate (buffer electrode plate for thermal stress) made of Mo or W. In order to improve uniformity of switching operation, large current turn-off capability, and the like, it is important to make contact conditions among the element electrodes, the intermediate electrode plates, and the external main electrode plates as uniform as possible, and to decrease contact thermal resistance and electrical resistance. Therefore, a countermeasure to decrease warps and waviness by improving precision (flatness, plainness) in manufacturing parts of the package has been generally adopted.

On the other hand, a plurality of chips have been mounted mainly by a package composition of wire-connecting electrodes in a type called a module type structure in IGBTs and the like. In case of the module type package, heat generated in the internal portion of the element chip is released from only one side of the package (a plane which has not been connected by wire), that is, the side of the package where the electrode has been mounted directly on a base substrate. Accordingly, thermal resistance is generally significant, and the number of chips which can be mounted on a package, and a usable current capacity (an amount of heat generation, or a mounting density) were limited.

Currently, in order to solve the above problems and to respond to a demand for increasing the capacity, a semiconductor device having a press contacting structure of multi-chips in parallel, wherein a plurality of IGBT chips are assembled in parallel in a flat type package so as to be capable of taking out an emitter electrode and collector electrode formed on the main planes of each chips by plane-contacting to a pair of external main electrode plates provided at the package, such as disclosed in JP-A-8-88240 (1996) has been receiving attention. In accordance with the semiconductor device having a press contacting structure of multichips in parallel, variations in height of each position of every chip caused by variation in dimensions of the members (parts), and variations in warps and waviness of the main electrode plate per location can not be avoided. Accordingly, the pressure varies per chip, and uniform contacts cannot be obtained. Then, the thermal resistance and the electrical resistance per position of every chip varied remarkably, and a serious problem that the characteristics of the elements were unstable as a whole was created. The problem can be solved by the simple step of using the members having severely precise dimensions. However, the above countermeasure cannot be deemed as realistic, because increasing a production cost and a selection cost of the members cannot be avoided. For solving the above problem, JP-A-8-88240 (1996) discloses a method to insert a soft metallic sheet having a ductility such as silver as a thickness correcting plate.

The size of the element (wafer size) in the package of the GTO and the like will be increased for responding to the demand for increasing their capacities in the future. Accordingly, the warps, waviness, and the like of the package members (electrode members) are in a trend to be increased in accordance with increasing the diameter or the element. The countermeasure to decrease warps and waviness by improving precision in manufacturing parts of the package (flatness, plainness) as described previously has a limit in manufacturing, and a serious problem in cost. Accordingly, it becomes increasingly difficult to ensure a uniform contact between the wafer and the package members (electrodes) in the whole plane of the element size (wafer size), and to decrease the thermal resistance and the electrical resistance.

On the other hand, in accordance with the method of inserting a soft metallic sheet disclosed as a countermeasure for solving the problem of uniform contact between chips of the semiconductor device having a press contact structure of multichips in parallel as described previously, it has been revealed by study of the inventors of the present invention that the amount of deformation of the sheet is very little (deforming only by elastic deformation) with a pressure in the range of practical use, i.e. the pressure which does not destroy at least the semiconductor chip, and the amount of deformation is not sufficient for ensuring uniform contact when the variation in height per position of every chip (and the height including the intermediate electrode members interposing the chip, and others) is remarkable.

The reason can be estimated that, when a pressure is added to a soft metallic sheet in a thickness direction to cause a plastic deformation in a lateral direction as indicated schematically in FIG. 25, deformation resistance in the lateral direction becomes extremely large, even if the soft metallic material is used, due to a friction force (friction resistance) 56 generated at the boundary between the electrode members 54, 55 interposing the soft metallic sheet 53. Even if the pressure is increased in order to cause a plastic deformation, the friction force is increased in proportion to the pressure, and the plastic deformation cannot be readily caused. Particularly, in a case of a sheet form, wherein the area receiving the resistance is remarkably larger than the thickness, influence of the friction force generated on the surface of the area becomes dominant, and even if a pressure exceeding the yield stress of the material known to the public is added, substantial plastic deformation (flow) is not caused practically, and the thickness of the soft metallic sheet is scarcely changed before and after pressing.

The present invention is to provide a method for ensuring a uniform press contact condition on a large area region, which has been becoming more difficult than ever in accordance with increasing the size of the package by increasing the diameter of the wafer, and with connecting multichips in parallel of the element corresponding to increasing the capacity. That is, the present invention is to provide a method which is capable of accommodating the variation in height of the contacting plane (warps, waviness, variation in dimensions of the members, and the like), and of decreasing the thermal resistance and electrical resistance at the contacting boundary planes. The second object of the present invention is to provide a converter preferable for a system of a large capacity by using the semiconductor device obtained by the above methods.

SUMMARY OF THE INVENTION

In accordance with the press contact type semiconductor device relating to the present invention, a semiconductor element comprising at least a first main electrode on a first main plane, and a second main electrode on a second main plane is assembled between a pair of main electrode plates, and a metallic body having macroscopic vacancies inside is arranged between electrodes of said semiconductor element and the main electrode plate.

Furthermore, in accordance with the press contact type semiconductor device having a practical composition relating to the present invention, a semiconductor element comprising at least a first main electrode on a first main plane, and a second main electrode on a second main plane is assembled between a pair of main electrode plates, and any one selected from at least a metallic netting, a plate manufactured to be uneven, and a porous metallic plate is arranged between electrodes of said semiconductor element and the main electrode plate.

BRIEF DESCRIPTION OF THE DRAWINGS

FIG. 18 is a schematic cross section indicating an embodiment of the present invention applied to an IGBT.

DESCRIPTION OF THE PREFERRED EMBODIMENT

Figure 1:
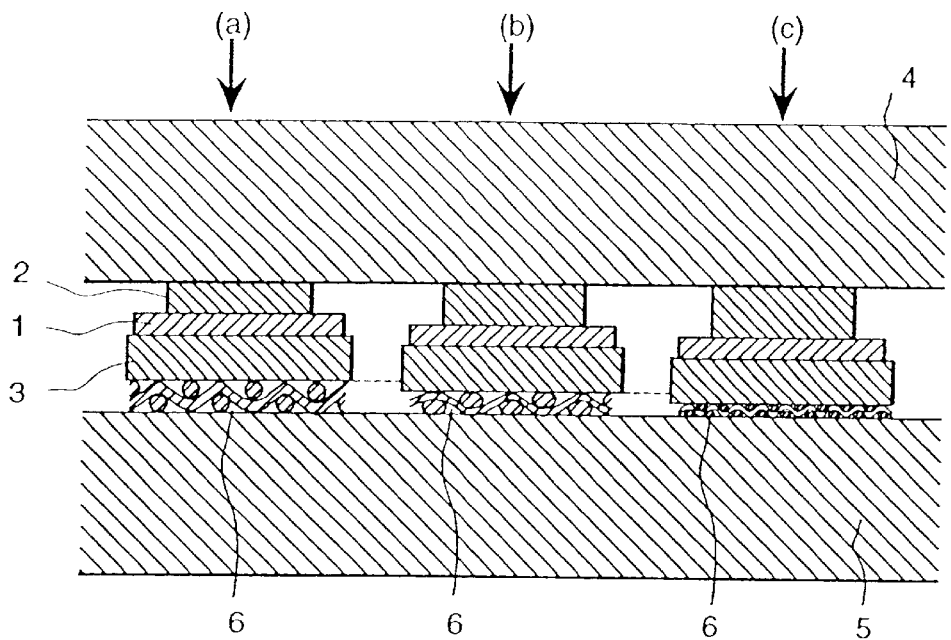
FIG. 1 is a schematic cross section indicating a fundamental composition of the present invention, FIGS. 2(*a*) to 2(*c*) are a set of schematic illustrations indicating models of deformation processes of metallic netting caused by pressing.

A fundamental application state of the present invention is indicated in FIG. 1. At least a first main electrode is formed on a first main plane, and a second main electrode is formed on a second main plane in a semiconductor element 1. Intermediate electrode plates 2, 3 composed of Mo, W, and the like are arranged above both main electrode planes, and furthermore, a pair of main electrode plates (common electrode plates) 4, 5 composed of Cu, or a Cu alloy are arranged at outer side portions of the intermediate electrode plates. In accordance with the present embodiment, a metallic body having macroscopic vacancies inside such as a metallic netting, or a metallic plate manufactured to be uneven 6, is inserted between the intermediate electrode plate 3 and the main electrode plate 5, and all the members are contacted each other by pressing the whole together. FIG. 1 indicates examples in the order of increasing the total height of the member 1, 2, and 3 by the position of (a), (b), and (c). Corresponding to these heights, the thickness of the metallic netting, or the metallic plate manufactured to be uneven 6, which were a definite thickness before the pressing, have been decreased in the order of (a), (b), and (c) by crushing and thinning. That means the metallic netting, or the metallic plate manufactured to be uneven, is deformed by pressing so that the total heights including the height of the metallic netting, or the metallic plate manufactured to be uneven (a sum of the heights of the members 1, 2, 3, and 6) become equal at the positions of (a), (b), and (c), and their thickness is varied. Therefore, even in a case if each of the above members 1, 2, and 3 differs from each other in thickness, and the main electrode plates 4, 5 have warps and waviness, the semiconductor element can be mounted with ensuring a desirable press contact state at the plural chip positions (a), (b), and (c), and a semiconductor device having less variation in thermal resistance and electrical resistance can be realized. In accordance with FIG. 1, an example wherein the metallic netting, or the metallic plate manufactured to be uneven 6 is inserted in the plane contacting with pressure facing to the main electrode plate 5 and the intermediate electrode plate 3 is indicated. However, the inserted position can be at other contacting planes such as between the main electrode plate 4 and the intermediate electrode plate 2, between the element 1 and the intermediate electrode plates 2, 3, and plural contacting planes can be used concurrently. Furthermore, the metallic nettings different from each other, or the metallic plates manufactured to be uneven different from each other per each of the planes between the electrodes can be arranged.

Figure 2A:
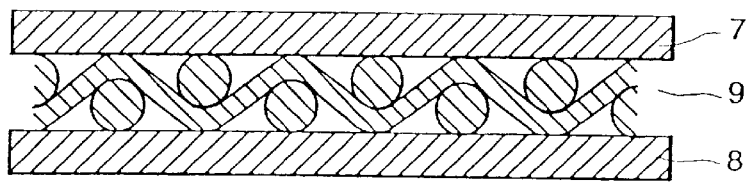
Figure 2B:
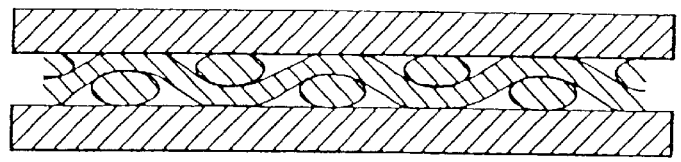
Figure 2C:
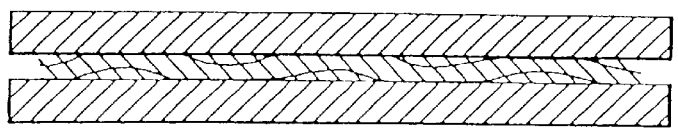
Figure 3:
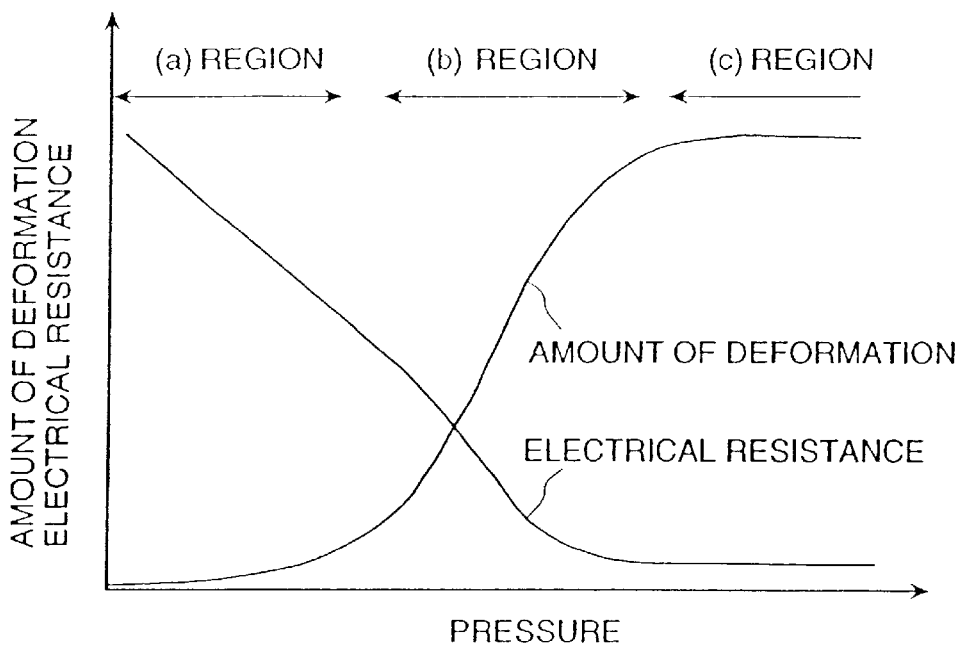
FIG. 3 is a graph indicating the effects of the pressure on the amount of deformation in the thickness direction or electrical resistance of the metallic netting, FIGS. 4(*a*) to 4(*h*) are a set of cross sections indicating examples of cross sectional structure of metallic plates manufactured to be uneven, FIGS. 5(*a*) to 5(*f*) are a set of photographs indicating appearances of the metallic plates manufactured to be uneven, FIGS. 6(*a*) to (6*c*) are a set of schematic illustrations indicating models of deformation processes caused by pressing the metallic plates manufactured to be uneven.

FIGS. 2(*a*) to 2(*c*) are a set of schematic illustrations indicating a model of deformation processes of the metallic netting 9 provided between the electrode plate 7 and the electrode plate 8 caused by pressing. FIG. 2(*a*) indicates a contacting state before causing a large pressure deformation, FIG. 2(*b*) indicates a state during deformation under pressing, and FIG. 2(*c*) indicates a state after the deformation is completed thoroughly by the applied pressure. FIG. 3 indicates the effects of the pressure on the amount of deformation in the thickness direction of the metallic netting, that is a variation in thickness, or electrical resistance when the metallic netting is contacted between two electrodes with pressure.

In the states of FIG. 2(*a*) and the (a) region of FIG. 3, loading is too small, and the amount of deformation in the thickness direction of the metallic netting is small. Since the contacting electrical resistance between the electrode plate and the metallic netting depends significantly on the pressure, values of the electrical resistance are decreased remarkably in accordance with increasing the pressure. If further larger load is added, the metallic netting 9 provided between the electrode plate 7 and the electrode plate 8 is deformed significantly by compression as indicated in FIG. 2(*b*) and the (b) region of FIG. 3. That is, metallic wires (fiber) composing the metallic netting are deformed significantly with compression, and the thickness of the metallic netting is decreased. This is because the load is concentrated to the portion where the metallic netting is contacted with the electrode plates 7, 8, the pressure applied to this portion becomes extremely higher than the apparent pressure, and the metallic netting starts to be readily deformed by compression. Since the metallic netting has a large amount of openings, spatial restriction against the deformation of the pressed metal is reduced, which is different from the case of a dense metallic foil (thin plate) indicated in FIG. 25, and the metallic netting is easily deformed by pressure. Accompanied with this deformation, the contacting area between the surface of the electrode plate 7 and the electrode plate 8 with the metallic netting is increased. Furthermore, since the amount of deformation of this portion is significant, oxide film on the surface of the metal is broken and a desirable contact with a newly generated plane can be obtained. Therefore, the contacting boundary planes generated at this time are in a very closely contacting state. In accordance with this effect, the electrical resistance is decreased further.

Figure 25:
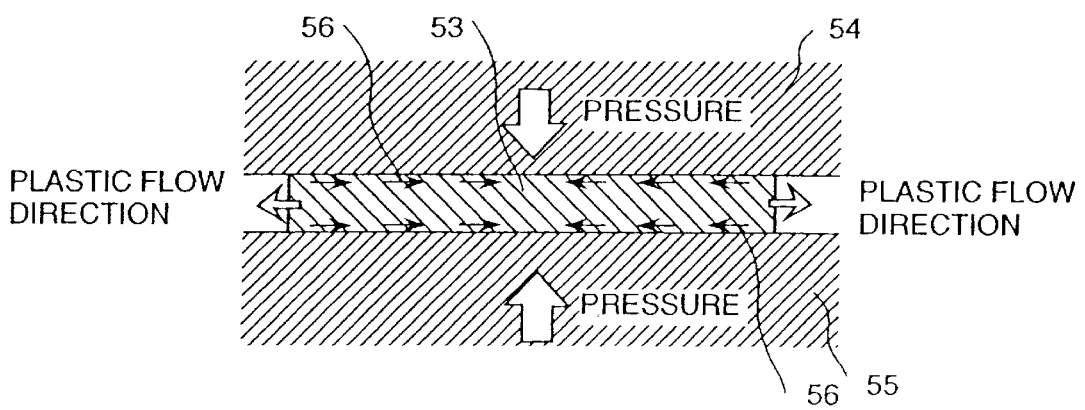
FIG. 25 is an illustration for explaining deformation behavior of the soft metal when it is pressed by a conventional method.

After the deformation of the metallic netting is generated sufficiently, the pressure at the contacting plane is not increased so much even if the loading is increased, because the electrode plates 7, 8 and the metallic netting 9 are contacted with a large area. Furthermore, since the deformation resistance is increased by the same reason as indicated in FIG. 25, variation rate of the amount of deformation is decreased as indicated in FIG. 2(*c*) and region (c) of FIG. 3. Theoretically, if an infinite loading can be added, deformation until the interval between the boundary planes can be filled completely can be achieved. Practically, the interval cannot be filled completely on account of the restriction of the loading and the like, and some portions remain as uncontacted. However, the effect of the uncontacted portions on the electrical resistance is not significant, and a desirably small electrical resistance can be obtained. In accordance with observed results on the thermal resistance, approximately the same behavior as the observed results on the electrical resistance was indicated.

The metallic netting referred to in the present invention includes, in addition to a sheet of netting woven with metallic fiber by various weaving techniques, a sheet of netting woven with conductive fiber such as carbon fiber and the like, and a sheet material having a complex structure composed of an organic resin core and a metal surface layer. The material for the metallic fiber can be selected from the group consisting of soft metals having a small electrical resistance and thermal resistance such as copper, aluminum, silver, gold, and the like; significantly soft metal such as soldering material and the like; materials of inexpensive and superior oxidation resistance such as nickel, stainless steel (SUS), and the like; and materials superior in high temperature characteristics as Ni base alloys and the like such as inconel and the like. The material having the most suitable characteristics in consideration of the applied target can be selected. Corresponding to the amount of deformation, electrical resistance, and thermal resistance required in the region of necessary loading, optimization in using of various weaving techniques such as plain weaving, twill weaving, plain tatami weaving, twill tatami weaving, and the like; various diameters of fiber; various mesh sizes; and others is desirable. Generally speaking, the amount of deformation can be increased if the diameter of the fiber is increased. On the other hand, in order to control the range of the loading wherein the deformation occurs, it is generally effective to decrease the mesh size for increasing the number of contacting points of the netting with the electrodes. Since the amount of deformation of the complex sheet material, wherein resin fiber is coated with metal, can be made larger than that of the sheet material made of metallic fiber, it is particularly effective in use, which requires a large amount of elastic deformation.

The metallic plate manufactured to be uneven referred to in the present invention means a metallic body, which is manufactured so as to have different thickness depending on positions, in contrast with conventional metallic plate, metallic foil, and metallic sheet, which generally mean a flat dense body having substantially a uniform thickness. Metallic plates called by various names such as expanded metal, meshed metal, grid metal, slit metal, punched metal, embossing manufactured plate, dimple manufactured plate, wave plate, and the like are included in the metallic plates of the present invention. Representative examples of shapes are indicated in FIGS. 4(a) to (h) as the cross sectional shapes of the models, and examples of appearance photographs are indicated in FIGS. 5(a) to (f) (FIGS. 5(a) and (d) expanded metal, FIGS. 5(b) and (e) slit manufactured plate, and FIGS. 5(c) and (f) embossed manufactured plate).

Figure 6A:
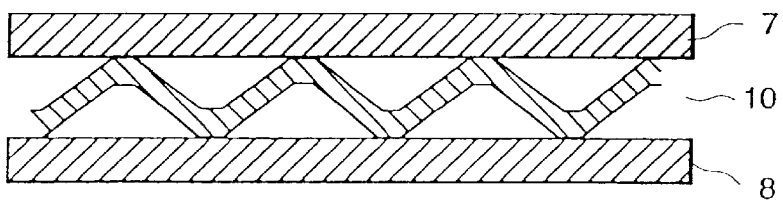
Figure 6B:
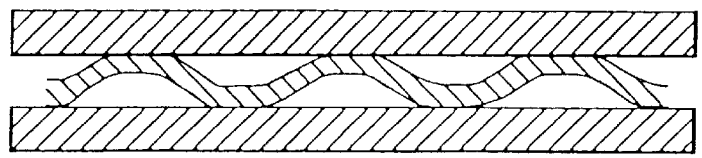
Figure 6C:
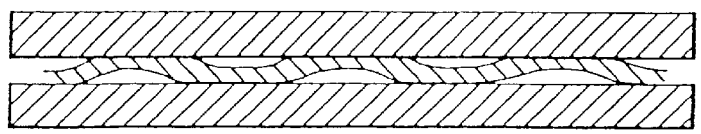
Figure 4A:
Figure 4B:
Figure 4C:
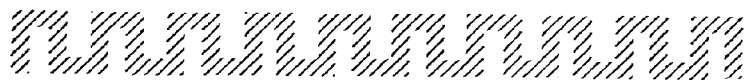
Figure 4D:
Figure 4E:
Figure 4F:
Figure 4G:
Figure 4H:
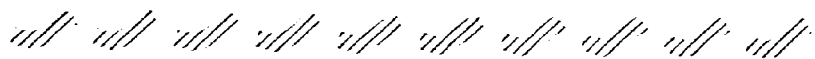
Figure 5A:
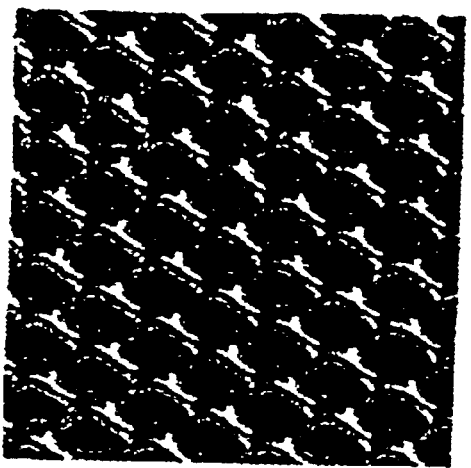
Figure 5B:
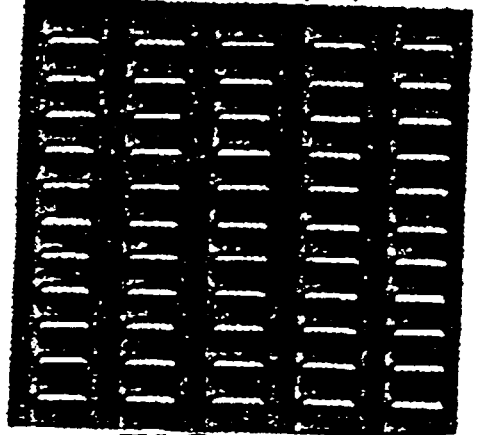
Figure 5C:
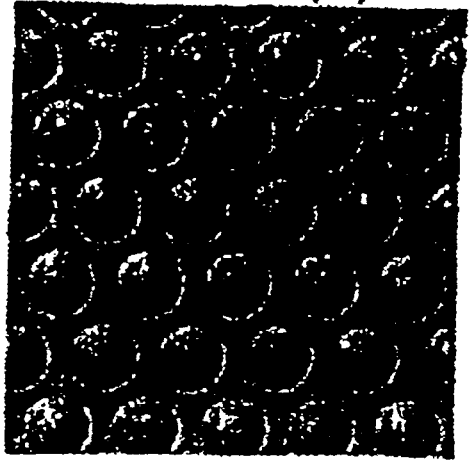
Figure 5D:
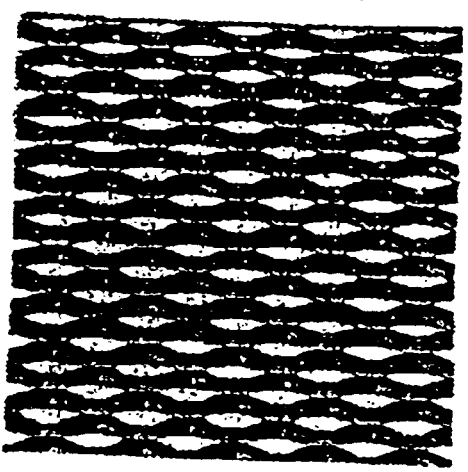
Figure 5E:
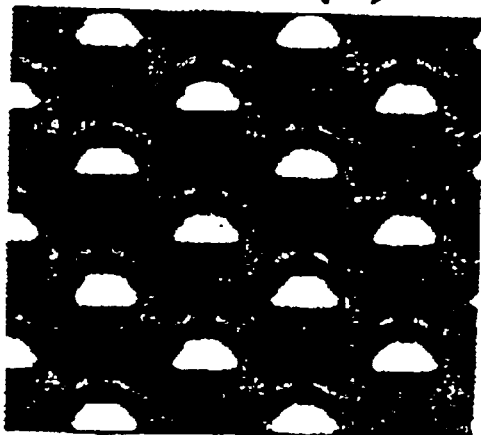
Figure 5F:
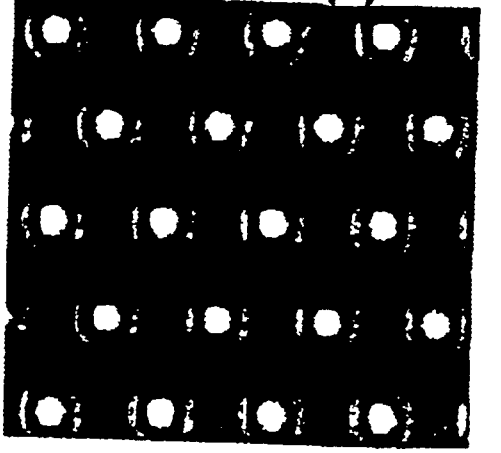

As an example of metallic plate manufactured to be uneven, a model of deformation processes of a wave plate 10 caused by pressing is indicated in FIGS. 6(a) to (c) indicate a contacting state before causing a significant deformation by pressure, FIG. 6(b) indicates a state during deformation, and FIG. 6(c) indicates a state after deformation has occurred sufficiently by pressure. In accordance with increasing the load, the wave plate 10 provided between the electrode plate 7 and the electrode plate 8 is significantly deformed in a certain range of pressure, which is determined by the plate thickness, material of the plate, manufactured waving pitch, manufactured shape, and others. That means the waving shape portion which has been manufactured to be uneven is deformed significantly by compressing, and thickness of the wave plate 10 is decreased. Different from the case of a dense metallic foil (thin plate) shown in FIG. 25, relatively large pressure deformation can be readily obtained, because a large number of spaces exist around the portion manufactured to be uneven as much as manufactured to be uneven and the deformation of the pressed metal is scarcely restricted spatially. In accordance with the deformation, the contacting area of the surfaces of the electrode 7 and the electrode 8 with the wave plate 10 is increased. Furthermore, since the amount of deformation of this contact portion is significant, the oxide film on the surface of the metal is broken and a desirable contact with a newly generated plane can be obtained. Therefore, the contacting boundary planes generated at this time are in a very closely contacting state. In accordance with these effects, the electrical resistance and the thermal resistance is decreased significantly. After the wave plate 10 deformed significantly, the electrodes 7, 8 come to contact with the wave plate 10 by a remarkably large area, and the pressure per area is not increased so much even if the applied load is increased. Furthermore, the variation rate of the amount of deformation becomes small, because the deformation resistance is increased the same as the case shown in FIG. 25.

As the material for the metallic plate, the material having the most suitable characteristics corresponding to the applied target can be selected from the group consisting of copper, aluminum, silver, gold, soldering material, nickel, stainless steel (SUS), and various alloys such as Ni base alloys and the like the same as the previous case. Regarding the thickness of original plate manufactured to be uneven, and the depth and pitches of the manufacturing to be uneven, the most suitable conditions corresponding to the amount of deformation, electrical resistance, and thermal resistance required for the necessary pressure range can be selected. The most suitable material and surface processing are desirably selected depending on the using condition of the semiconductor device based on which must be given priority, for example, decreasing the thermal resistance and electrical resistance, or improving the deformation capability.

When ensuring at a large amount of deformation is desirable, any of a method of arranging the metallic netting, or the metallic plates manufactured to be uneven into plural different positions between electrodes, and a method of arranging a combined assembly of plural metallic netting, or plural metallic plates manufactured to be uneven into an interval between electrodes is desirable. When the combined assembly of the plural metallic netting or the plural metallic plates manufactured to be uneven is used, a pre-treatment to assemble them into a body previously is effective.

Since these materials have elastic-plastic deformation capabilities, a return as much as the elastic deformation can be observed when the loading is discharged after deformed. However, the plastic deformation corresponding approximately to the variation in height among mounted members can be ensured.

In case of re-pressing, sufficient contacts can be ensured with the same pressure as previous pressure utilizing the elastic deformation.

As a method for decreasing the contacting resistance between the metallic netting, or the metallic plate manufactured to be uneven with electrodes interposing them, forming a metallic layer, which is softer and more oxidation resistant than the metallic material of the metallic netting and the metallic plate, onto the surface of the metallic netting, or the metallic plate by means such as printing, plating, and the like is desirable. Particularly, it is effective when a hard metallic material, or a readily oxidized metal is used. For instance, a Ni netting or a Ni plate manufactured to be uneven coated with a soft film made of Ag or Au, or a metallic netting or a metallic plate manufactured to be uneven made of Cu or Al having an oxidation preventing film made of Ag or Au at its surface is used.

Furthermore, as another method, a method of arranging a dense metallic foil onto the surface of the metallic netting, or the metallic plate manufactured to be uneven, and forming a body together can be used. For the above metallic foil, using a metallic foil which is softer and more oxidation resistant than the metallic material of the metallic netting and the metallic plate is effective. For instance, a metallic netting or a metallic plate manufactured to be uneven made of Cu or Al having a metallic foil made of any of Cu, Al, Ag, Au, and the like on its surface is used.

In order to realize correction of heights, and decrease of electrical resistance and thermal resistance most suitably, not only a metallic netting or a metallic plate manufactured to be uneven, but also a soft metallic foil can be arranged concurrently between the electrodes. For instance, a method for ensuring approximately the same amount of deformation with the same loading even if the contacting areas differ from each other by inserting an Au foil between the upper main electrode plate and the intermediate electrode plate, and inserting a metallic netting or a metallic plate manufactured to be uneven between the lower main electrode plate and the intermediate electrode plate is effective.

Figure 7:
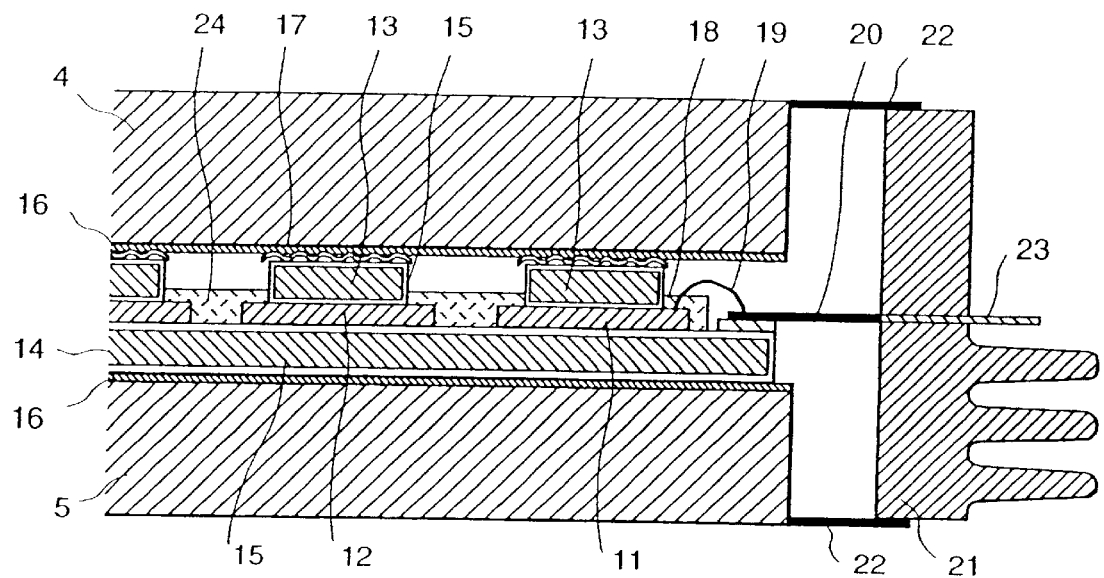
FIG. 7 is a schematic cross section indicating an embodiment of the present invention applied to an IGBT.

FIG. 7 indicates an embodiment of the present invention applied to a reverse conductive type switching device, wherein a flywheel diode (FWD) 12 connected to a switching device using IGBT 11 in reverse parallel is integrated. FIG. 7 indicates a partial cross section from an outermost portion of the press contact type semiconductor device at right the side to the middle portion toward the center. In accordance with the IGBT chip 11, an emitter electrode is formed on almost the whole plane of a first main plane at an upper side, a collector electrode is formed on a second main plane at a lower side, and, furthermore, an electrode for controlling (gate electrode) is formed on the first main plane. In accordance with the FWD 12, an anode electrode is formed on the upper plane of the silicon substrate, and a cathode electrode is formed on the lower plane of the silicon substrate. Each of these semiconductor chips is arranged on an integrated intermediate electrode 14 made of Mo, which operates to remove heat and concurrently to connect electrically, and, furthermore, is arranged so as to contact with each of the main electrodes on the chips via each intermediate electrode 13 per respective ones of the chips. This composition is further interposed between a first common main electrode plate (Cu) 4 and a second common main electrode plate (Cu) 5. A wave plate 17 made of Cu, i.e. a metallic plate manufactured to be uneven, is inserted between the intermediate electrode 13 and the common main electrode plate 4.

An Au plated film 15 is formed on the surface of the intermediate electrode plate by approximately 1 $\mu$m in thickness, and a Ni plated film 16 is formed on the surface of the common electrode plate by approximately 1–3 $\mu$m in thickness. The above semiconductor chips and the intermediate electrode are fixed mutually by a frame 24. A lead wire is taken out from the gate electrode 18 of the IGBT chip 11 by a wire bond 19, and is connected to the gate electrode wiring plate 20 formed on the intermediate electrode 14. An interval between the above pair of common main electrode plates 4, 5 is insulated externally by an insulating outer cylinder 21 made of ceramics and the like, and a hermetic structure is formed at an interval between the common main electrode plate and the insulating outer cylinder by sealing inside the package by a metallic plate 22. The gate electrode lead is taken out to outside the package by a sealed wiring 23 through the external cylinder 21.

The above wave plate 17 used in the present embodiment was made of Cu, its wave pitch was 1 mm, the thickness of the plate was 0.3 mm, and its surface was thin gold plated. The whole thickness of the wave plate including the initial uneven portion was 0.6 mm. Variation in thickness of the intermediate electrode plate mounted practically in the present embodiment was 100 $\mu$m at maximum. However, results of determining pressure distribution by inserting pressure sensitive paper between the intermediate electrode plate 14 and the chips 11, 12 revealed that the pressure difference was small, and they were pressed almost uniformly.

Figure 8:
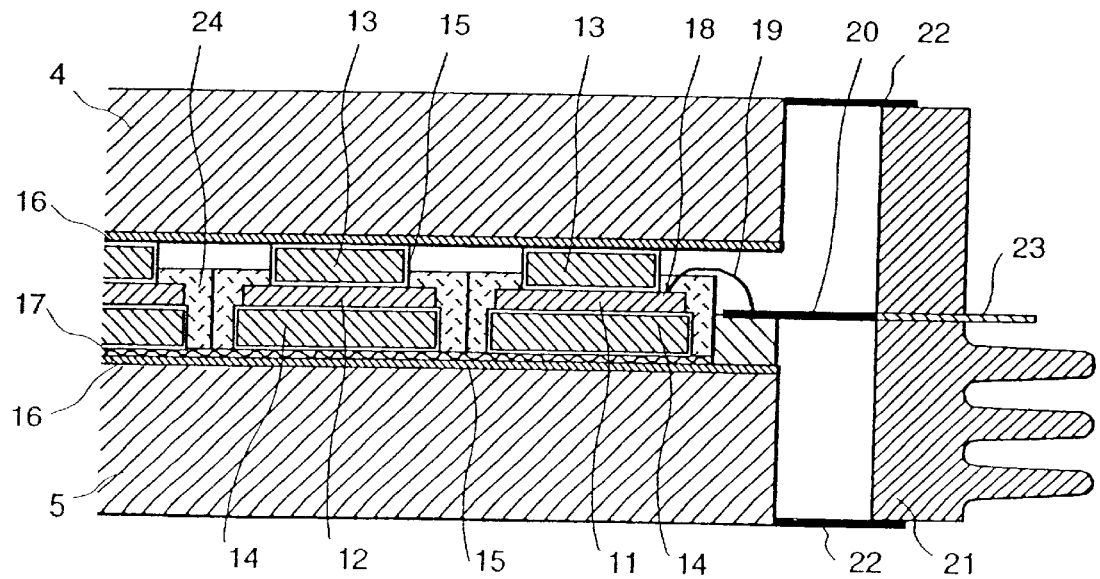
FIG. 8 is a schematic cross section indicating an embodiment of the present invention applied to an IGBT.

FIG. 8 indicates an embodiment of the present invention applied to a reverse conductive type switching device, wherein a MOS control type switching device 11 and a flywheel diode 12 are integrated. Main electrodes (collector, cathode) at the lower side of each of these semiconductor chips are made of Au, and are connected to an intermediate electrode 14, whereon an Ag plated film 15 of 2–3 $\mu$m thickness is formed previously, by heating and pressure welding. On the other hand, main electrodes (emitter, anode) at an upper side of each of these semiconductor chips are made of Al, and are connected to an intermediate electrode 13, whereon an Au plated film 15 of 1–2 $\mu$m thickness is formed previously. In accordance with the present embodiment, the above integrated intermediate bodies of electrodes and semiconductor chips are arranged in parallel between a first common main electrode plate (Cu) 4, a Ni plated film 16 of 2–4 $\mu$m thickness is formed on its surface previously, and a second common main electrode plate (Cu) 5. In this case, an expanded metal plate 17 was inserted as the metallic plate manufactured to be uneven between the intermediate electrode 14 and the common main electrode plate 5, and the whole body was pressed via both pf the common main electrode plates 4, 5.

The expanded metal plate 17 was made of Ag, thickness of the metal plate was approximately 0.1 mm, approximately 3000 mesh, and the whole thickness including the initial uneven portion was approximately 0.25 mm. Variation in thickness at each position of the chips mounted practically in the present embodiment was 80 $\mu$m at maximum. However, results of determining pressure distribution by inserting pressure sensitive paper between the intermediate electrode plate 13 and the common main electrode plate 4 revealed that the pressure difference was small, and they were pressed almost uniformly.

Figure 9:
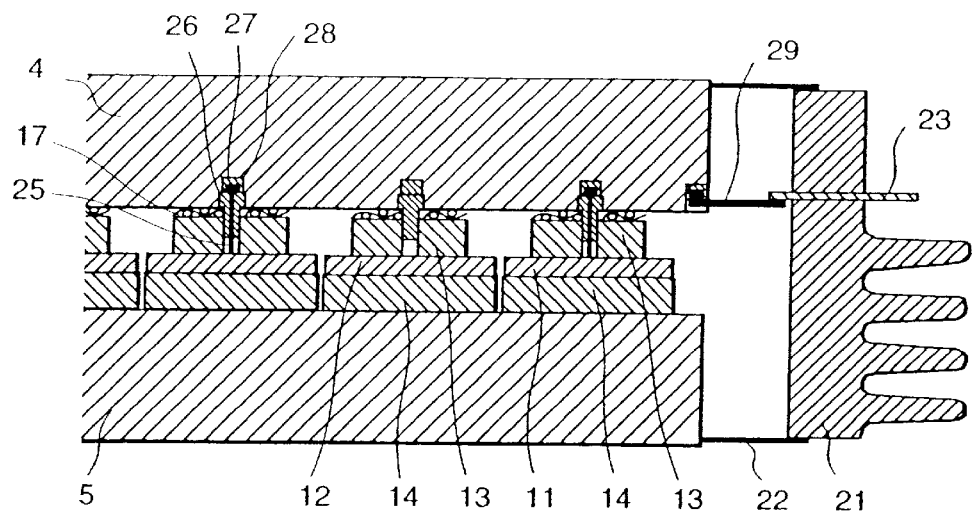
FIG. 9 is a schematic cross section indicating an embodiment of the present invention applied to an IGBT.

FIG. 9 indicates an example of the mounting state, wherein a pin 25 for taking out a gate control electrode from the chip is formed at the center of the chip. FIG. 9 indicated an embodiment of the present invention applied to a reverse conductive type switching device, wherein a flywheel diode (FWD) 12 connected to a switching device using IGBT 11 in reverse parallel was integrated, the same as shown in FIG. 7. Main electrodes (collector, cathode) at a lower side of each of these semiconductor chips are made of Au, and are connected to an intermediate electrode 14, whereon an Ag plated film of 2–3 $\mu$m thickness is formed previously, by heating and pressure welding. On the other hand, the surface of the intermediate electrode 13 is plated with an Au film 15 of 2–3 $\mu$m thickness, and is connected to each of the semiconductor chips by press contact. The above integrated bodies of electrodes and semiconductor chips are inserted between a first common main electrode plate (Cu) 4 and a second common main electrode plate (Cu) 5. In this case, in order to absorb the variation in height, complex metallic nettings 17 composed of double-overlapped netting manufactured in a shape having a hole at the center are arranged around the pin 25 and a member 26 for insulating the pin between the intermediate electrode plate 13 and the common electrode plate 4. In accordance with this method, shifting the location of respective complex netting 17 can be prevented by the member 26 for insulating the central pin, and an assembling operation can be performed easily.

The complex netting composed of double-overlapped metallic nettings can be integrated into a body at their peripheral portions by stamping the double-overlapped nettings to a designated shape using a die, and the complex netting can be handled as a single complex netting component.

The gate circuit 27 is contained in a groove 28 provided to the first common main electrode plate (Cu), taken out to the periphery of the package, and further taken out by the wire 29, 23 to outside the package. In accordance with the present embodiment, the complex netting made of Cu was used, and its surface was plated with Au in order to decrease the contacting resistance further. Accordingly, the contacting resistance between the intermediate electrode plate and the common electrode plate could be decreased significantly. The above effect was remarkable in the region where the pressure was small. Variation in thickness at each position of the chips mounted practically in the present embodiment was 200 $\mu$m at maximum. However, results of determining pressure distribution by inserting pressure sensitive paper between the intermediate electrode plate 14 and the common main electrode plate 5 revealed that the pressure difference was small, and they were pressed almost uniformly.

As explained above, in the case when various kinds of semiconductor chips are arranged in parallel and mounted in a package, and their thickness are varied significantly depending on their kind, the following method is effective; that is, the intermediate electrode plates having various average thickness depending on the kinds of the chips are prepared; remarkable differences of the thickness of the chips are adjusted with the intermediate electrode plates; furthermore, the metallic netting, or the metallic plate manufactured to be uneven with the present invention is used for accommodating the variation in height of the intermediate electrode plates and the semiconductor chips.

Figure 10:
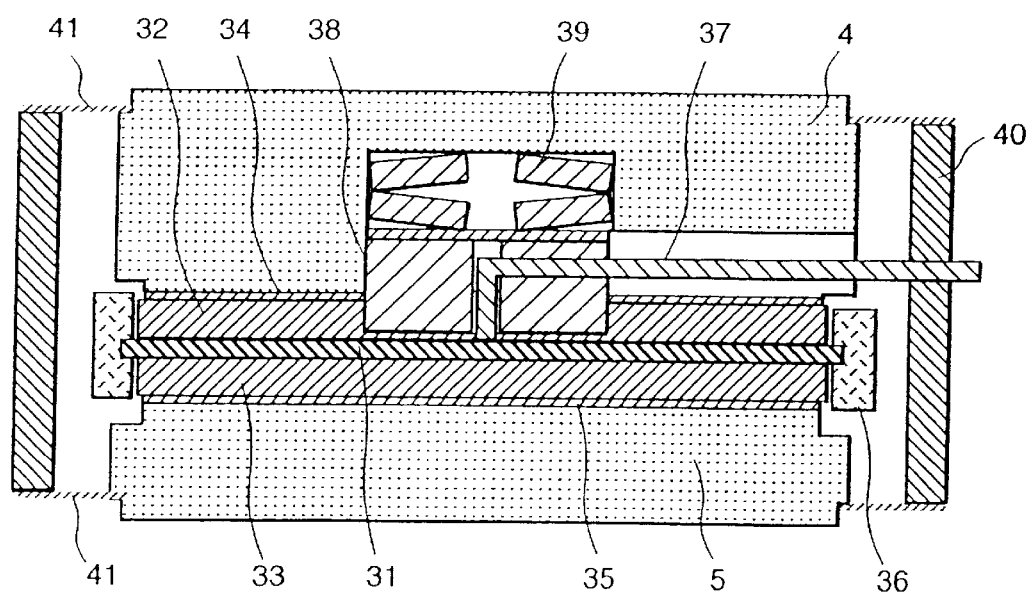
FIG. 10 is a schematic cross section indicating an embodiment of the present invention applied to a wafer size semiconductor element.

FIG. 10 indicates an embodiment of the present invention applied to a GTO. A semiconductor element substrate 31 is made of silicon (Si), and has at least a PN junction inside. Cathode electrodes and gate electrodes made of aluminum (Al) are formed on one of main planes of the semiconductor element substrate 31, and anode electrodes made of aluminum (Al) are formed on another main plane. Intermediate electrode plates 32, 33 made of molybdenum (Mo) are arranged on the upper side of the cathode electrode and the anode electrode, respectively. Metallic netting 34, 35 made of Cu were arranged between the intermediate electrode plates 32, 33 and a pair of external main electrode plates 4, 5 made of copper (Cu), and the whole body was pressed. A cap member 36 is arranged at side planes of the semiconductor element substrate 31. A part of gate lead 37 is arranged and contacted on the gate electrode on the semiconductor substrate, and the part is contacted with the gate electrode by pressing with the gate insulator 38 and a disc spring 39. All the above parts are arranged in a sealed package surrounded by an insulator 40, a pair of external electrodes 4, 5, and a flange 41. Another end of the gate lead 37 is taken out outside the insulator 40 via a sealing structure as a gate terminal.

Figure 11:
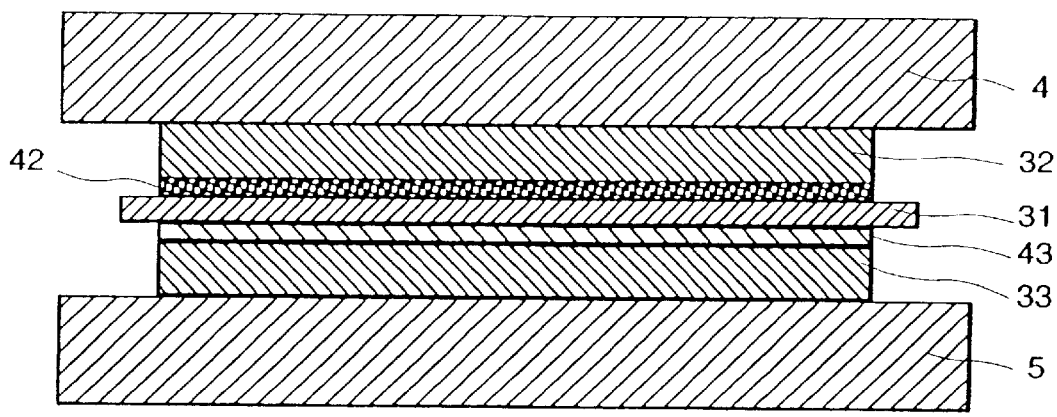
FIG. 11 is a schematic cross section indicating an embodiment of the present invention applied to a wafer size semiconductor element.

FIG. 11 indicates an embodiment, wherein a punching metal 42 made of Cu, a dense Ag thin film layer is formed on its surface, is arranged between a cathode electrode side of a semiconductor element 31 of wafer size and an intermediate electrode plate 32. A metal foil 43 of Mo and an intermediate electrode plate 33, each of which is plated with Ag respectively, were arranged between an anode electrode side of the semiconductor element 31 and a common electrode plate 5. The variation in height could be absorbed with the punching copper plate 42 better than a flat copper plate, and contacting resistance could be decreased.

Figure 12:
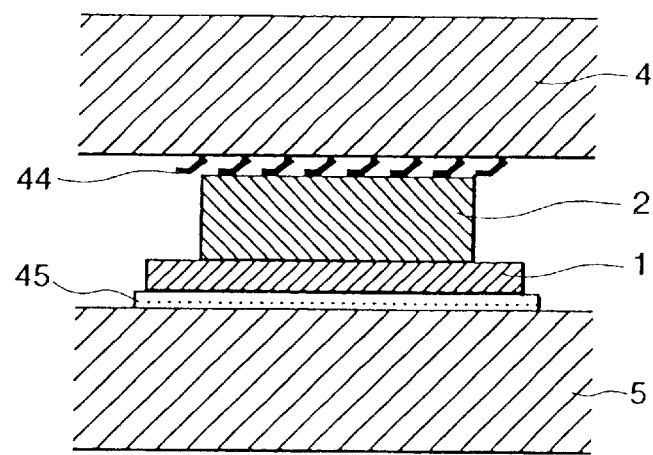
FIG. 12 is a schematic cross section indicating an embodiment of the present invention.

FIG. 12 indicates an embodiment, wherein no intermediate electrode plate is inserted between a collector side electrode of the semiconductor chip 1 and a main electrode plate 5. In order to prevent rupture by pressing the semiconductor element, a metallic netting, or a metallic plate manufactured to be uneven was arranged between an intermediate electrode plate 2 and a main electrode plate 4 of the emitter side. In accordance with the present embodiment, an embossed plate 44 manufactured to have slits was used as the metallic plate manufactured to be uneven. A soft metal foil 45 was inserted between a chip main electrode and a main electrode plate 5, in order to decrease further contacting resistance and to protect the chips.

Conventionally, the surface of the common electrode plate, and the intermediate electrode plate have been necessarily finished to make their maximum surface roughness (Rmax) less than 1 $\mu$m, in order to decrease their contacting resistance. However, even if the surface of the common electrode plates and the intermediate electrode plates, which interposes the metallic netting, or metallic plate manufactured to be uneven, soft metal foil, and the like, is coarse such that its maximum surface roughness (Rmax) exceeds 1 $\mu$m, the material is deformed matching with uneven shape of the surface, and contacting area is increased microscopically and contacting resistance can be decreased. Therefore, production cost can be decreased.

As the material for the intermediate electrode, a material having a thermal expansion coefficient at a middle of Si and a material of the external main electrode, and a desirable thermal conductivity and electrical conductivity is used. Practically, a single metal such as tungsten (W), molybdenum (Mo), or complex material or alloys containing these element as a main composition material such as Cu—W, Ag—W, Cu—Mo, Ag—Mo, Cu—FeNi, and the like, a complex material of metal with ceramics or carbon, for instance, such as Cu/SiC, Cu/C, Al/SiC, Al/AlN, Cu/Cu$_2$O, and the like are desirable.

On the other hand, as the material for the main electrode, a conductive material having a desirable thermal conductivity such as copper, aluminum, and their alloys, for instance, using Cu—Ag, Cu—Sn, Cu—Zr, Cu—Zr—Cr, Cu—Ni—Si—Zr, and the like, or the above complex materials are desirable.

Figure 13:
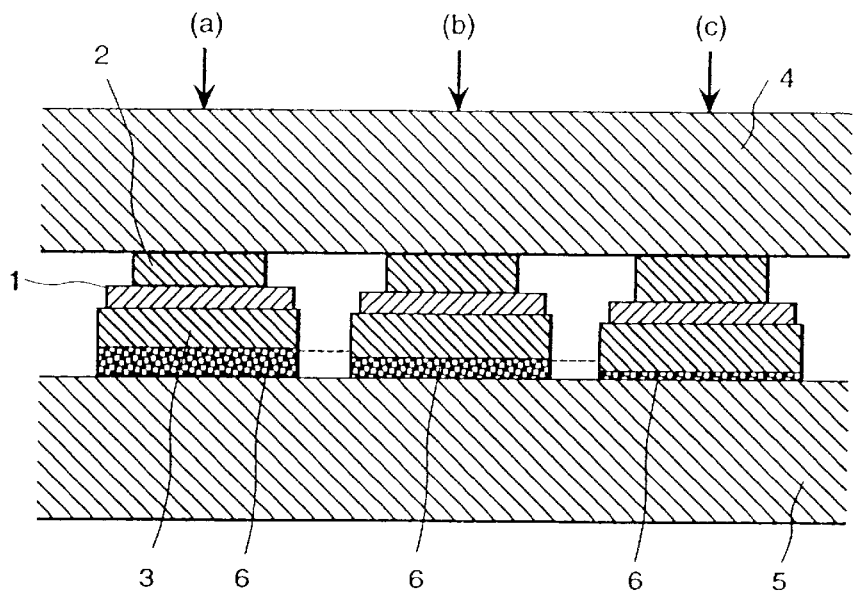
FIG. 13 is a schematic cross section indicating another fundamental composition of the present invention.

FIG. 13 indicates another applying state of the present invention. At least a first main electrode is formed on a first main plane of a semiconductor element 1, and a second main electrode is formed on a second main plane. Intermediate electrode plates 2, 3 made of Mo, or W and others are arranged on both of the main electrode planes, and furthermore, common electrode plates (main electrode plate) 4, 5 made of copper, and the like, are arranged at outer portions of the intermediate electrode plates. A porous metallic plate 6, as an example of a metallic body having macroscopic vacancies inside, is inserted between the intermediate electrode plate 3 and the main electrode plate 5, and each of the members are contacted by pressing its whole body together. FIG. 13 indicates a case when a sum of the heights of the members 1, 2, and 3 is increased in the order at the positions of (a), (b), and (c). Corresponding to the difference of these heights, the thickness of the porous metallic plates 6 are decreased in the order of (a), (b), and (c) after contacting with pressure, although their thickness before contacting have been same. That means, the thickness of the porous metallic plate has been varied so as to make the whole height including the height of the porous metallic plate (a sum of the members 1, 2, 3, and 6) equal at the positions of (a), (b), and (c). Therefore, even if each of the members 1, 2, and 3 has various thicknesses, and even if the main electrode plates 4, 5 have warps and waviness, a preferable contacting state with pressure can be ensured at plural chip positions (a), (b), and (c), and the semiconductor chips can be mounted with the preferable contacting state. Accordingly, a semiconductor device having less variation in thermal resistance and electrical resistance can be realized. In accordance with FIG. 13, an embodiment, wherein the porous metallic plate 6 is inserted between contacting planes with pressure facing to the main electrode plate 5 and the intermediate electrode plate 3, is indicated. However, the inserting position can be varied to other contacting planes, such as between the main electrode plate 4 and the intermediate electrode plate 2, between the element 1 and the intermediate electrode plates 2, 3, and plural boundary planes can be used concurrently. Furthermore, various porous metallic plates made of different material from each other can be arranged at respective ones of intervals between the electrodes.

The porous metal referred to in the present invention is metallic material including a large number of voids, while terminology of metallic plate, metallic foil, and metallic sheet mean in general substantially dense metallic members. The porous metal has a fine structure, wherein a three dimensional random network of continuous metallic portions is formed. Examples of the porous metal include foamed metal, sponge metal, porous metal, foam metal, and the like. In accordance with the target of the present invention, the soft materials having a small electrical resistance and thermal resistance such as copper, aluminum, silver, gold, and the like, and materials of inexpensive and superior in oxidation resistance such as nickel, stainless steel (SUS), and the like are preferable in particular, and the material having the most suitable characteristics in consideration of the applied target can be selected.

Figure 14:
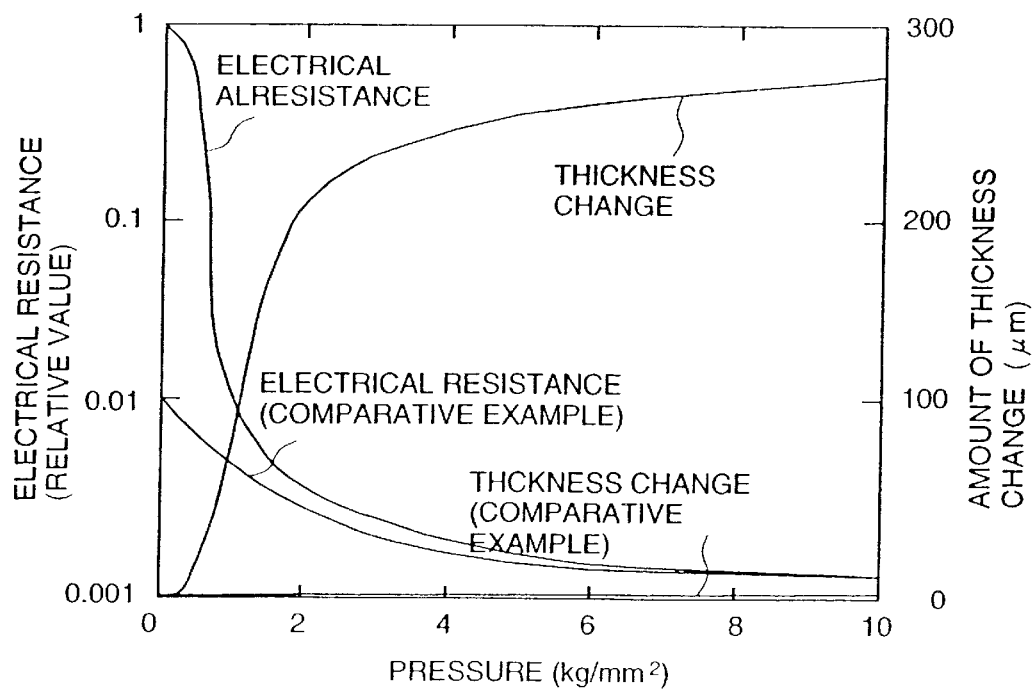
FIG. 14 is a graph indicating the effects of the pressure on the amount of thickness change or electrical resistance of porous metallic plate, FIGS. 15(*a*) to 15(*b*) are a set of schematic enlarged illustrations indicating fine surface structures of the porous metallic materials.

FIG. 14 indicates the effects of the pressure on the amount of deformation (the amount of change in the thickness of porous metallic plate) and electrical resistance, determined by using a porous Cu plate (foamed metal copper plate) as the representative of the porous metallic plate. As a comparative example, a case when a conventional dense thin Cu plate is used is concurrently indicated in FIG. 14. The foamed metal copper plate is prepared by the steps of: forming a coated film of copper powder on the surface of vacancies in foamed urethane by a dry adhesion method; removing the urethane by thermal processing; and sintering the copper powder in a reducing atmosphere. The foamed metal copper plate is a porous copper metal plate having a three dimensional network skeleton of copper. Another method, wherein Cu coating film is formed on surface of foamed resin by a wet plating method, is similarly usable. Thickness of the porous Cu plate is decreased accompanied with increasing pressure. The porous Cu plate is deformed significantly in a specific pressure region (approximately 0.5–2 kg/mm$^2$), and the amount of deformation is decreased accompanied with increasing its density. The electrical resistance is decreased with increasing the pressure, and is changed significantly in the specific region of remarkable deformation of the porous Cu plate. On the contrary, in case of Cu thin plate, significant deformation caused by plastic deformation is not generated even if a pressure exceeding its yield stress is applied as explained previously (FIG. 25), but only minor deformation as much as elastic deformation is generated. Electrical resistance is decreased gradually, because contact resistance with a measuring electrode is decreased in accordance with increasing pressure.

In case of the porous metal, different from the case of dense metal foil (thin plate) (FIG. 25), a large deformation can be occurred by relatively small pressure, because the porous metal itself has vacancies at its interior portion, and microscopically the material pressed with a force can be moved easily to these vacancies. The deformation occurs substantially only in a thickness direction (a pressing direction), because the porous metal itself has vacancies, which make it possible to absorb the deformation, at its interior portion, and deformation resistance by friction in a lateral direction at the contacting planes. Accordingly, the porous metal after the deformation has less vacancies than the initial period, and becomes dense. The shape of the vacancy is varied to be flatten in the thickness direction. As described above, the material of the present invention makes it possible to decrease electrical resistance and thermal resistance effectively with ensuring a capability to cause significant deformation to the thickness direction, because the material of the present invention has a feature that a metallic channel portion particularly in the thickness direction is more increased by deformation with pressure in comparison with the lateral direction. When conventional dense material is deformed (decreasing its thickness) significantly, the material as much as its changed volume flows plastically in the lateral direction, and a phenomenon that a side plane of the material is swelled remarkably can be observed. However, when the porous material is used, its side plane is scarcely swelled even if it is deformed (decreasing its thickness) significantly, because the porous metal itself has sufficient vacancies, which makes it possible to absorb the deformation of the material, at its interior portion. Therefore, since any problems such as contacting with adjacent material are not generated, the porous material is suitable for high density mounting.

Since these materials have elastic-plastic deformation capabilities, a return as much as the elastic deformation can be observed when the loading is discharged after being deformed. However, the plastic deformation corresponding approximately to the variation in height among mounted members can be ensured. In case of re-pressing, sufficient contacts can be ensured with the same pressure as previous pressure utilizing the elastic deformation. Furthermore, since the porous material has a lower apparent elastic coefficient than the conventional dense material on account of the presence of voids, the amount of elastic deformation is large, and the porous material is suitable for maintaining a certain contacting state. The pressure causing the deformation, and the elastic-plastic deforming behavior can be controlled by the thickness, density (fraction of the vacancies), and material of the continuous portion of metal formed in three dimensions. These factors can be selected so as to cause the deformation by an appropriate pressure in accordance with the using condition.

When ensuring a large amount of deformation is desired, a large fraction of vacancy in the porous metallic material before the deformation is desirable, larger than 50% is desirable, and particularly a range of 60–80% is preferable. However, when the amount of deformation is not desired to be excessively large in view of operability based on its use, it is desirable to adjust the porous plate to have an optimum amount of deformation, thermal resistance, and electrical resistance in view of its use by decreasing the void fraction (densification) by pressing previously with a designated pressure.

Figure 15A:
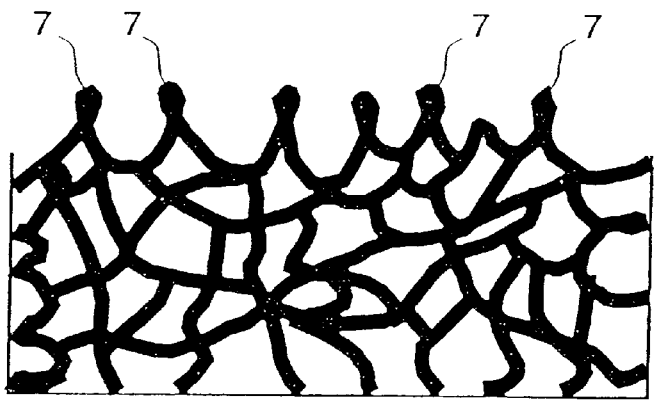
Figure 15B:
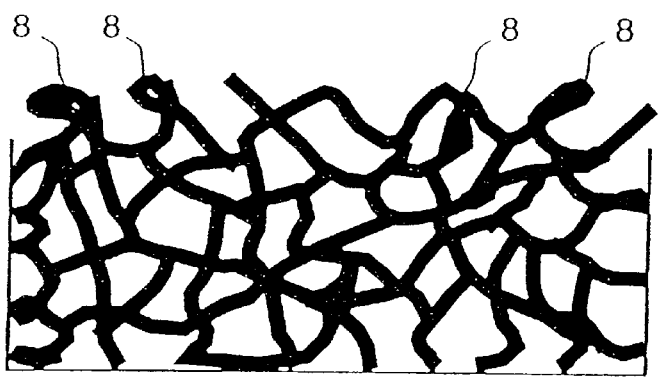

As indicated in FIG. 14, the contacting resistance (electricity, heat) in the practical use condition at a boundary with the electrodes interposing the porous metallic plate becomes an important factor. In order to decrease the contacting resistance further, it is important to make the contacting resistance at the boundary with the electrodes interposing the porous metallic plate as small as possible. Therefore, a microscopic shape at the outermost surface of the porous metallic plate is more desirable to be a structure shown in FIG. 15(b), which has a large number of terminal parts approximately parallel to the contacting surface, or of terminal parts 8 having as large a declining angle as possible, than a structure shown in FIG. 15(a), which has a large number of columnar metal portions 7 extruding perpendicularly to the contacting surface.

Figure 16:
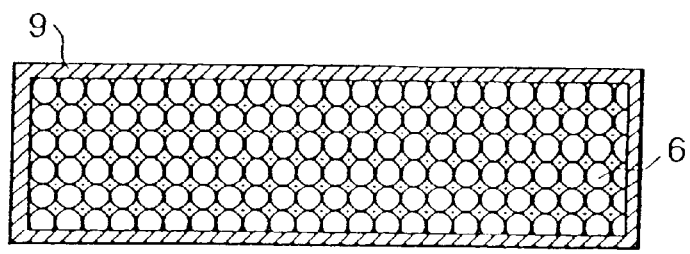
FIG. 16 is a schematic cross section indicating a cross sectional structure of the porous metallic material, whereon a dense metallic layer is formed on the surface, FIGS. 17(*a*) and 17(*b*) are a schematic cross section indicating a cross sectional structure of the porous metallic material, whereon a dense metallic layer is formed on the surface.

As another state of the porous metallic plate for decreasing the contacting resistance of the porous metallic plate with electrode materials interposing the porous metallic plate, it is effective to make the surface of the porous metallic plate denser than its internal portion to increase the microscopic contacting area with the electrode material. Embodiments are indicated in FIG. 16 and FIGS. 17(a) and (b). FIG. 18 indicates an embodiment, wherein a metallic layer 9, which is softer and more oxidation resistant than the metallic material of the porous metallic plate, is formed onto the surface of the porous metallic plate 6 by means such as printing, plating, and the like. For instance, a porous metallic plate made of Ni coated with a soft film made of Ag or Au, or a porous metallic plate made of Cu or Al having an oxidation preventing film made of Ag or Au at its surface is used. FIG. 17(a) indicates an embodiment, wherein a dense metallic foil 10 is arranged onto the surface of porous metallic plate 6, and a body is formed together. For the above metallic foil, using a metallic foil which is softer and more oxidation resistant than the metallic material of the porous metallic plate, in addition to the same material as the porous metallic material, is effective. For instance, a porous metallic plate made of Cu or Al having a metallic foil made of any of Cu, Al, Ag, Au, and the like on its surface is used. FIG. 17(b) indicates a cross section of a plate obtained by punching out from the material indicated in FIG. 17(a) with a pressing machine. Because the end planes are crushed when pressing is performed, the porous metallic plate becomes a shape that side planes are also covered with the surface foil. Therefore, the above method is a simple and convenient method for a case when side planes of the porous metallic plate are desirably protected with a dense film. As another method, a method for increasing its density only at the surface of the porous metallic plate by exposing it to a high temperature for a short time can be used.

FIG. 18 indicates an embodiment of the present invention applied to a reverse conductive type switching device, wherein a flywheel diode (FWD) 12 connected to a switching device using IGBT 11 in reverse parallel is integrated. FIG. 18 indicates a partial cross section from outermost portion of the press contact type semiconductor device at a right side to the middle portion toward the center. In accordance with the IGBT chip 11, an emitter electrode is formed on almost the whole plane of a first main plane at an upper side, a collector electrode is formed on a second main plane at a lower side, and, furthermore, an electrode for controlling (gate electrode) is formed on the first main plane. In accordance with the FWD 12, an anode electrode is formed on the upper plane of the silicon substrate, and a cathode electrode is formed on the lower plane of the silicon substrate. Each of these semiconductor chips is arranged on an integrated intermediate electrode 14 made of Mo, which operates to remove heat and concurrently to connect electrically, and, furthermore, is arranged so as to contact with each of the main electrodes on the chips via each intermediate electrode 13 per respective ones of the chips. This composition is further interposed between a first common main electrode plate (Cu) 4 and a second common main electrode plate (Cu) 5. A porous copper plate 17 is inserted between the intermediate electrode 13 and the common main electrode plate 4. An Au plated film 15 is formed on the surface of the intermediate electrode by approximately 3–5 µm in thickness, and a Ni plated film 16 is formed on the surface of the common electrode plate by approximately 1–3 µm in thickness. The above semiconductor chips and the intermediate electrode are fixed mutually by a frame 24 made of Teflon. A lead wire is taken out from the gate electrode 18 of the IGBT chip 11 by a wire bond 19, and is connected to the gate electrode wiring plate 20 formed on the intermediate electrode 14. An interval between the above pair of common main electrode plates 4, 5 is insulated externally by an insulating outer cylinder 21 made of ceramics and the like, and a hermetic structure is formed at an interval between the common main electrode plate and the insulating outer cylinder by sealing inside the package by a metallic plate 22. The gate electrode lead is taken out to outside the package by a sealed wiring 23 through the external cylinder 21.

The above porous copper plate was prepared by the steps of: forming a sheet from Cu powder slurry by doctor blade method, calcining the sheet for removing organic binder components, and reducing and pre-sintering of the Cu powder so that voids remain at a higher temperature. Initial void fraction was 60%, average void diameter was 30 µm, and thickness was 150 µm. Variation in thickness of the intermediate electrode plate mounted practically in the present embodiment was 50 µm at maximum. However, results of determining pressure distribution by inserting pressure sensitive paper between the intermediate electrode plate 14 and the chips 11, 12 revealed that the pressure difference was small, and they were pressed almost uniformly.

Figure 19:
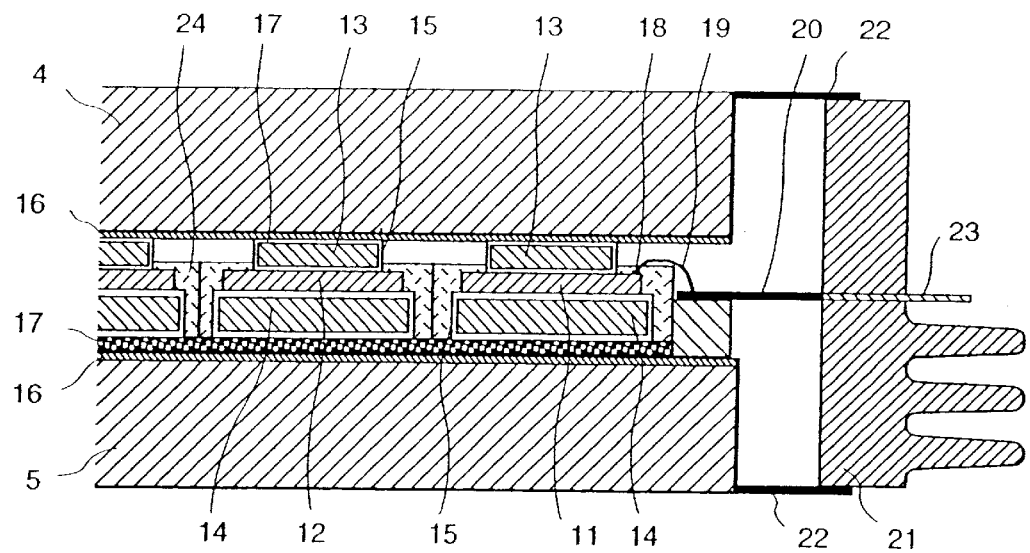
FIG. 19 is a schematic cross section indicating an embodiment of the present invention applied to an IGBT.

FIG. 19 indicates an embodiment of the present invention applied to a reverse conductive type switching device, wherein a MOS control type switching device 11 and a flywheel diode 12 are integrated. Main electrodes (collector, cathode), at a lower side of each of these semiconductor chips are made of Au, and are connected to an intermediate electrode 14, whereon an Ag plated film 15 of 2–3 µm thickness is formed previously, by heating and pressure welding. On the other hand, main electrodes (emitter, anode) at an upper side of each of these semiconductor chips are made of Al, and are connected to an intermediate electrode 13, whereon an Au plated film 15 of 1–2 µm thickness is formed previously. In accordance with the present embodiment, the above integrated intermediate bodies of electrodes and semiconductor chips are arranged in parallel between a first common main electrode plate (Cu) 4, an Ag plated film 16 of 2–4 µm thick is formed on its surface previously, and a second common main electrode plate (Cu) 5. In this case, a porous Ni plate 17 was inserted between the intermediate electrode 14 and the common main electrode plate 5, and the whole body was pressed via both of the common main electrode plates 4, 5.

The porous Ni plate 17 was obtained by the steps of: processing foamed resin for making it have conductivity, plating with electrolytic Ni, and heat treating for removing the foamed resin by burning. This material was further pressed to be formed as a plate material having a void diameter of approximately 0.2 mm, the number of cells of 60 pieces/inch, thickness of the metallic channel portion of 40–80 µm in, plate thickness of 0.6 mm, and void fraction of approximately 80%. In accordance with the present embodiment, the contacting resistance between the porous Ni plate and the above electrodes is reduced significantly, because both of the surfaces of electrodes at both sides interposing the porous Ni plate are plated with Ag. Variation in thickness at each position of the chips mounted practically in the present embodiment was 100 µm at maximum. However, results of determining pressure distribution by inserting pressure sensitive paper between the intermediate electrode plate 13 and the common main electrode plate 4 revealed that the pressure difference was small, and they were pressed almost uniformly.

In order to realize correction of the height and decrease of the electrical resistance and the thermal resistance at optimum, not only the porous metallic plate, but also soft metal foil can be inserted concurrently between the electrodes. For instance, a following method is effective: an Au foil is inserted between the upper main electrode plate and the intermediate electrode plate, and a porous Ni plate is inserted between the lower main electrode plate and the intermediate electrode plate, for ensuring approximately the same amount of deformation with a same loading even in a case when the contacting areas differ from each other.

Figure 20:
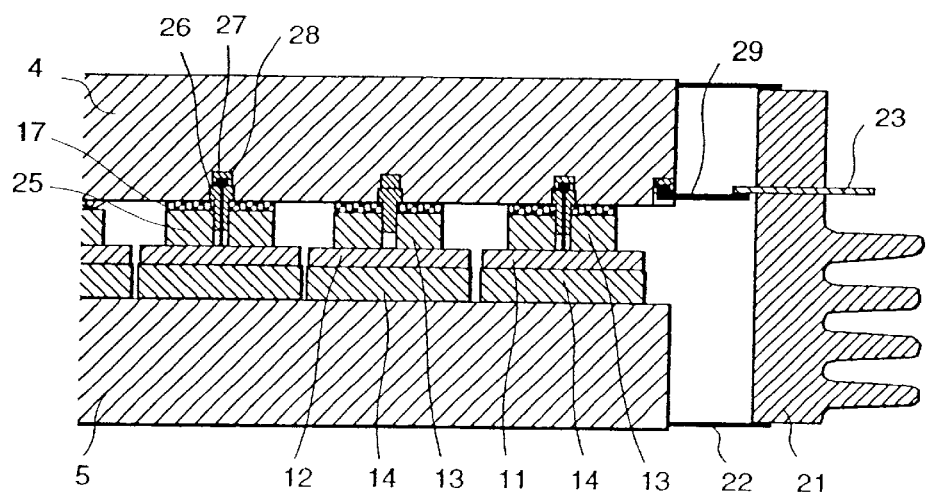
FIG. 20 is a schematic cross section indicating an embodiment of the present invention applied to an IGBT.

FIG. 20 indicates an example of mounting state, wherein a pin 25 for taking out a gate control electrode from the chip is formed at the center of the chip. FIG. 20, indicates an embodiment of the present invention applied to a reverse conductive type switching device, wherein a flywheel diode (FWD) 12 connected to a switching device using an IGBT 11 in reverse parallel was integrated, the same as shown in FIG. 18. Main electrodes (collector, cathode) at a lower side of each of these semiconductor chips are made of Au, and are connected to an intermediate electrode 14, whereon an Ag plated film of 2–3 µm thickness is formed previously, by heating and pressure welding. On the other hand, the surface of the intermediate electrode 13 is plated with an Au film 15 of 2–3 µm thickness, and is connected to each of the semiconductor chips by press contact. The above integrated bodies of electrodes and semiconductor chips are inserted between a first common main electrode plate (Cu) 4 and a second common main electrode plate (Cu) 5, on each surface of them an Au plated film of 2–4 µm thickness is formed. In this case, in order to absorb the variation in height, porous copper plates 17 manufactured in a shape having a hole at the center are arranged around the pin 25 and a member 26 for insulating the pin between the intermediate electrode plate 13 and the common electrode plate 4. In accordance with this method, shifting the location of respective porous metallic plate 17 can be prevented by the member 26 for insulating the central pin, and an assembling operation can be performed readily.

The gate circuit 27 is contained in a groove 28 provided to the first common main electrode plate (Cu) 4, taken out to the periphery of the package, and further taken out by the wire 29, 23 to outside the package. In order to decrease the contacting resistance further, a complex porous copper plate was utilized as the porous metallic plate in the present embodiment. The complex porous copper plate has a structure as shown in FIG. 17, wherein a dense copper foil was integrated onto the surface of the porous plate. Accordingly, the contacting resistance between the porous metallic plate and the intermediate electrode plate, and the common electrode plate could be decreased significantly. The above effect was remarkable in the region where the pressure was small, and the contacting resistance could be decreased from 1/5 to 1/10. Variation in thickness at each position of the chips mounted practically in the present embodiment was 200 µm at maximum. However, results of determining pressure distribution by inserting pressure sensitive paper between the intermediate electrode plate 14 and the common main electrode plate 5 revealed that the pressure difference was small, and they were pressed almost uniformly.

As explained above, in the case when various kinds of semiconductor chips are arranged in parallel and mounted in a package, and their thicknesses are varied significantly depending on their kind, a following method is effective, that is, the intermediate electrode plates having various average thicknesses depending on the kinds of the chips which are prepared; large differences of the thickness of the chips are adjusted with the intermediate electrode plates; furthermore, the porous metallic plate of the present invention is used for accommodating the variation in height of the intermediate electrode plates and the semiconductor chips.

Figure 21:
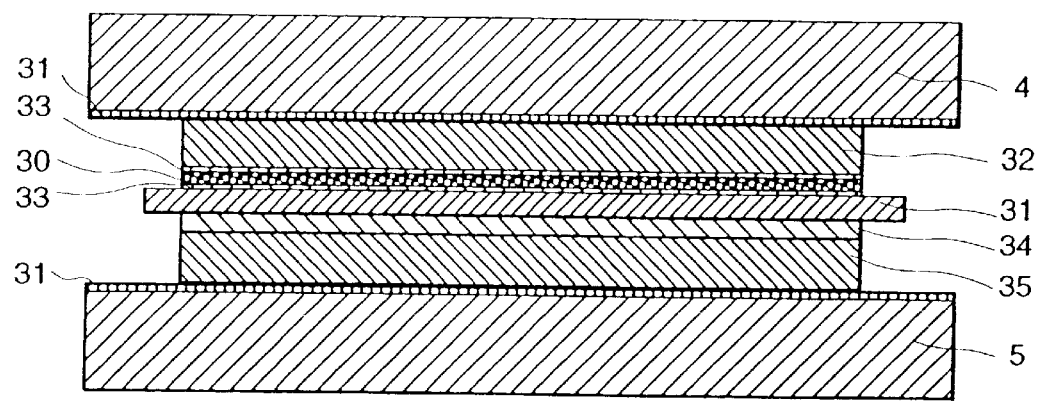
FIG. 21 is a schematic cross section indicating an embodiment of the present invention applied to a wafer size semiconductor element.

FIG. 21 indicates an embodiment wherein a porous copper plate 30, on which surface a dense thin film layer 33 of Ag is formed as a body, is arranged between cathode electrode side of a wafer size semiconductor element 31 and an intermediate electrode plate 32. A metal foil 34 made of Mo and an intermediate electrode plate 35 plated with Ag, respectively, were arranged between the anode electrode side of the semiconductor element 31 and a common electrode plate 5. The porous copper plate had an average void diameter of approximately 0.1 mm, cell number of 40 pieces/mm$^2$, thickness of metallic channel of 30–50 µm, plate thickness of 0.8 mm, and void fraction of approximately 75%. In accordance with the porous copper plate 30, variation of height is absorbed, and the contacting resistance can be decreased by compensating the decrease in contacting area based on voids at the surface of the porous metal.

Figure 22:
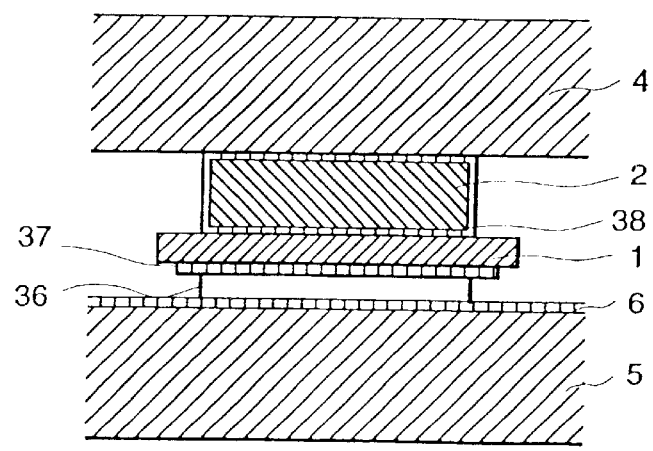
FIG. 22 is a schematic cross section indicating an embodiment of the present invention.

FIG. 22 indicates an embodiment, wherein no intermediate electrode plate is inserted between a collector side electrode of the semiconductor chip 1 and a common electrode plate. In order to prevent rupture of the semiconductor element by pressing when the intermediate electrode plate at the collector side is omitted, and a porous metallic plate was arranged between the common electrode plate 5 and the semiconductor element 1, it is important that the porous metallic plate 36 is arranged in a region the same or smaller than the shape of the intermediate electrode plate 2, on which surface a soft metal film 38 is formed. In accordance with the present embodiment, a soft metal foil 37 is inserted between a chip main electrode and the porous metallic plate, in order to decrease further contacting resistance and to protect the chips.

Conventionally, the surface of the common electrode plate, and the intermediate electrode plate have been necessarily finished to make their maximum surface roughness (Rmax) less than 1 µm, in order to decrease their contacting resistance. However, even if the surface of the common electrode plates and the intermediate electrode plates, which interposes the porous metallic plate, soft metal foil, and the like is coarse such that its maximum surface roughness (Rmax) exceeds 1 µm, the material is deformed matching with the uneven shape of the surface, and contacting area is increased microscopically and contacting resistance can be decreased. Therefore, production cost can be decreased.

As the material for the porous metallic plate, metals mainly such as Cu, Al, Ag, Au, Ni, and the like, or their alloys are desirable. Based on the use state of the semiconductor device, it is desirable to select optimum material and surface treatment in consideration of priority of decreasing the thermal resistance and electrical resistance, and improving deformation capability.

As the material for the intermediate electrode, a material having a thermal expansion coefficient at a middle of Si and a material of the external main electrode, and a desirable thermal conductivity and electrical conductive is used. Practically, a single metal such as tungsten (W), molybdenum (Mo), or complex material or alloys containing these element as a main composition material such as Cu—W, Ag—W, Cu—Mo, Ag—Mo, Cu—FeNi, and the like, a complex material of metal with ceramics or carbon, for instance, such as Cu/SiC, Cu/C, Al/SiC, Al/AlN, and the like are desirable. On the other hand, as the material for the main electrode, a conductive material having a desirable thermal conductivity such as copper, aluminum, and their alloys, or the above complex materials are desirable.

The mounting method of the present invention can be applied naturally to the press contact type semiconductor devices composed of only switching semiconductors such as IGBT and the like, without a diode. Additionally, the mounting method of the present invention is naturally effective in mounting, for instance, a large number of diodes in a press contact type package by the above method. Furthermore, the above embodiments are explained using mainly IGBTs, but targets of the present invention are all the semiconductor elements comprising at least a first main electrode on a first main plane and a second main electrode on a second main plane. Therefore, the present invention can be applied to the insulated gate type transistors (MOS transistor) other than IGBTs, the insulated gate type thyristors (MOS controlled thyristor) including IGCTs (Insulated Gate Controlled Thyristor), GTOs, thyristors, and diodes, and others in a similar way. Furthermore, the present invention is effective to the compound semiconductor elements such as SiC other than Si elements, GaN, and the like.

Figure 23:
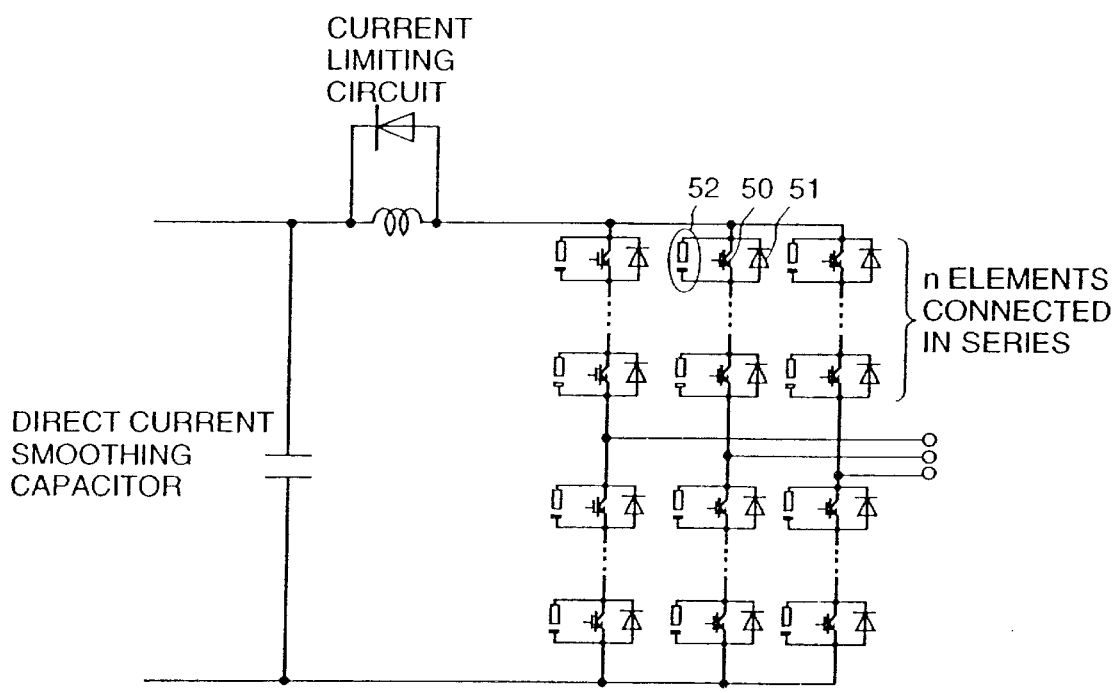
FIG. 23 is a circuit diagram indicating composition of a bridge using the semiconductor device of the present invention.
Figure 24:
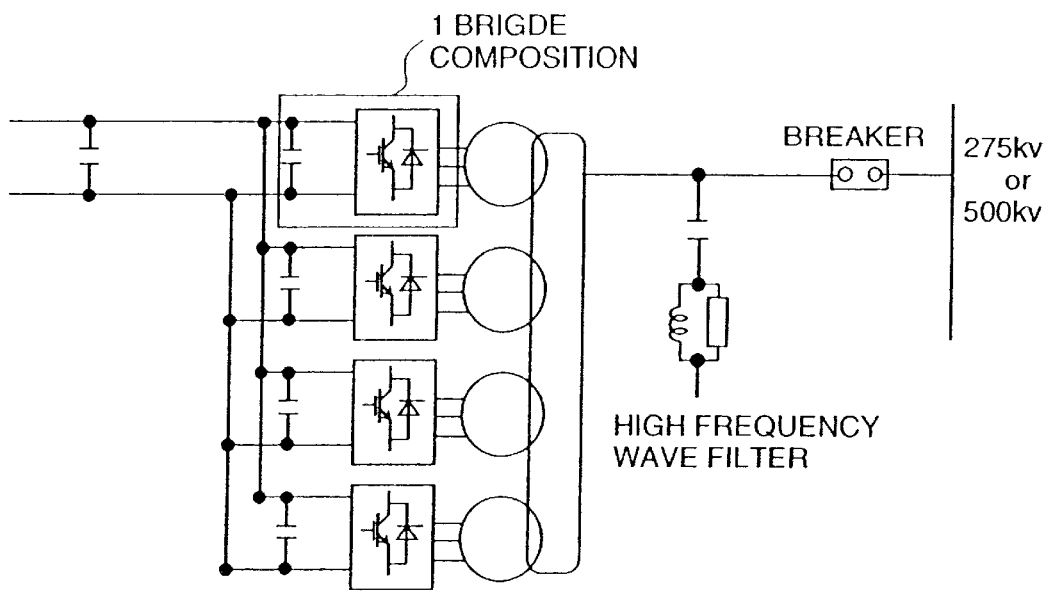
FIG. 24 is a circuit diagram indicating a composition of self-commutated converter using four bridges of the three phase bridge indicated in FIG. 23.

In accordance with the press contact type semiconductor devices of the present invention, stable contact conditions between electrodes can be obtained even if their size is increased (increasing capacity), so semiconductor devices having low electrical resistance and low thermal resistance can be obtained. Accordingly, a large capacity converter, of which converter volume and cost are reduced remarkably, can be realized by using the press contact type semiconductor device of the present invention. A composition circuit diagram of one, bridge, in a case when the press contact type semiconductor devices of an IGBT relating to the present invention are applied as main converting elements to a converter for power, is indicated in FIG. 23. The IGBT elements 40 as the main converting elements and diode elements 41 are arranged in reverse parallel, and the converter is composed by connecting n pieces of these elements in series. These IGBTs and diodes indicate the press contact type semiconductor device, wherein a large number of semiconductor chips are mounted in parallel, by the present invention. In cases of the reverse conductive IGBT press contact type semiconductor devices in embodiments of the present invention indicated in FIG. 7–FIG. 9, and FIG. 18–FIG. 20, the IGBT chips and the diode chips in the figures are assembled and contained in a package. Additionally, snubber circuits 42 and a current limiting circuit are added to the above assembly. A composition of a self-commutated converter using four bridges of the three phase bridge indicated in FIG. 23 is indicated in FIG. 24. The press contact type semiconductor devices of the present invention are mounted in a shape called a stack structure, wherein a plurality of the semiconductor devices connected in series interposing water-cooled electrodes in a shape to contact with outer side plane of the main electrode plate, and the whole stack is pressed together. In accordance with the present invention, uniform contact can be obtained with lower pressure than conventional products. Therefore, an effect to simplify the above stack structure and the like can be realized.

The press contact type semiconductor device of the present invention is particularly preferable not only for the above embodiments, but also for self-commutated large capacity converters using for power systems, and for large capacity converters used for mills. Furthermore, the press contact type semiconductor device of the present invention can be used for variable speed pumped storage power plants, substation facilities in building, substation facilities for railway, sodium-sulfur (NaS) battery systems, and converters for traction and the like.

In accordance with the present invention, uniform press contact state in a large area region, which has been becoming more difficult with increasing the size of packages accompanied with increasing the diameter of wafers and increasing the number of, chips connected in parallel in an element corresponding to increasing the capacity, can be easily realized with a relatively low pressure. That is, the variation in height of the contacting plane can be absorbed sufficiently, and thermal resistance and electrical resistance at contacting boundary planes can be decreased.

What is claimed is:

1. A power converter using a press contact type semiconductor device as a main converting element, wherein said semiconductor device comprises:
   a pair of main electrode plates;
   at least a semiconductor element assembled in an interval between said pair of main electrode plates, which comprises:
      at least a first main electrode on a first main plane, and
      a second main electrode on a second main plane; and
      a metallic body having macroscopic vacancies in its internal portion, being arranged between one of the first and second main electrodes of said semiconductor element and one of said main electrode plates.

2. A power converter using a press contact type semiconductor device as a main converting element, wherein said semiconductor device comprises:
   a pair of main electrode plates,
   at least a semiconductor element assembled in an interval between said pair of main electrode plates, which comprises:
      at least a first main electrode on a first main plane, and
      a second main electrode on a second main plane;
      a conductive intermediate electrode plate arranged between one of the main electrodes of said semiconductor element and one of the main electrode plates facing to the main electrode of said semiconductor element, and
      a metallic body having macroscopic vacancies in its internal portion, being arranged between said intermediate electrode plate and said one of the main electrode plates.

3. A power converter as claimed in claim 1 or 2, wherein said metallic body is any one selected from the group consisting of metallic netting, metallic plate manufactured to be uneven, and porous metallic plate.

4. A power converter using a press contact type semiconductor device as a main converting element, wherein said semiconductor device comprises:
   a pair of main electrode plates;
   at least a semiconductor element assembled in an interval between said pair of main electrode plates, which comprises:
      at least a first main electrode on a first main plane, and
      a second main electrode on a second main plane; and
      any one selected from the group consisting of metallic netting, metallic plate manufactured to be uneven, and porous metallic plate, being arranged between said semiconductor element and one of said main electrode plates.

5. A power converter using a press contact type semiconductor device as a main converting element, wherein said semiconductor device comprises:
   a pair of main electrode plates,
   at least a semiconductor element assembled in an interval between said pair of main electrode plates, which comprises:
      at least a first main electrode on a first main plane, and
      a second main electrode on a second main plane;
      a conductive intermediate electrode plate arranged between one of the first and second main electrodes of said semiconductor element and one of the main electrode plates facing to the one of the main electrodes of said semiconductor element, and
      any one selected from the group consisting of metallic netting, metallic plate manufactured to be uneven, and porous metallic plate, being arranged between said intermediate electrode plate and said one of the main electrode plates.

* * * * *